United States Patent
Kikkawa et al.

(10) Patent No.: US 7,859,020 B2
(45) Date of Patent: Dec. 28, 2010

(54) NITRIDE SEMICONDUCTOR DEVICE, DOHERTY AMPLIFIER AND DRAIN VOLTAGE CONTROLLED AMPLIFIER

(75) Inventors: Toshihide Kikkawa, Kawasaki (JP); Kenji Imanishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 48 days.

(21) Appl. No.: 12/173,392

(22) Filed: Jul. 15, 2008

(65) Prior Publication Data

US 2009/0058532 A1  Mar. 5, 2009

(30) Foreign Application Priority Data

Aug. 31, 2007  (JP)  ............... 2007-226594

(51) Int. Cl.
*H01L 31/072* (2006.01)
(52) U.S. Cl. ............... 257/194; 257/E29.249; 257/E29.271
(58) Field of Classification Search ......... 257/192, 257/194, 280, 281, E21.403, E29.249, E29.271; 438/167, 172

See application file for complete search history.

(56) References Cited

U.S. PATENT DOCUMENTS

| | | | |
|---|---|---|---|
| 5,568,086 A | 10/1996 | Schuss et al. | |
| 6,531,718 B2 | 3/2003 | Inoue et al. | |
| 6,696,866 B2 | 2/2004 | Mitzlaff | |
| 6,992,319 B2 | 1/2006 | Fahimulla et al. | |
| 7,352,008 B2 | 4/2008 | Kohn et al. | |
| 7,592,647 B2 * | 9/2009 | Nakata et al. | 257/194 |
| 7,638,819 B2 | 12/2009 | Kikkawa et al. | |
| 2001/0020700 A1 | 9/2001 | Inoue et al. | |
| 2006/0197107 A1 | 9/2006 | Kanamura et al. | |
| 2009/0045438 A1 | 2/2009 | Inoue et al. | |

FOREIGN PATENT DOCUMENTS

| | | |
|---|---|---|
| EP | 1463198 | 9/2004 |
| JP | 7-74552 A | 3/1995 |

(Continued)

OTHER PUBLICATIONS

K. Kawai et al., "AlN/GaN insulated gate heterostructure FET with regrown n+GaN ohmic contact"; Electronic Letters Mar. 10, 1998 vol. 34, No. 6.

(Continued)

*Primary Examiner*—Quoc D Hoang
(74) *Attorney, Agent, or Firm*—Fujitsu Patent Center

(57) ABSTRACT

A nitride semiconductor device includes a substrate, a stacked semiconductor structure formed over the substrate and including a electron channel layer of an undoped nitride semiconductor and an electron supplying layer of an n-type nitride semiconductor formed epitaxially over the electron channel layer, the n-type nitride semiconductor having an electron affinity smaller than an electron affinity of said undoped nitride semiconductor and a two-dimensional electron gas being formed in the electron channel layer along an interface to the electron supply layer, a gate electrode formed over the stacked semiconductor structure in correspondence to a channel region, and source and drain electrodes formed over the stacked semiconductor structure in ohmic contact therewith respectively at a first side and a second side of the gate electrode, the stacked semiconductor structure including, between the substrate and the electron channel layer, an n-type conductive layer and a barrier layer containing Al formed consecutively and epitaxially.

11 Claims, 16 Drawing Sheets

FOREIGN PATENT DOCUMENTS

| | | |
|---|---|---|
| JP | 8-330873 A | 12/1996 |
| JP | 2000-252458 A | 9/2000 |
| JP | 2001-196575 A | 7/2001 |
| JP | 2004-047764 A | 2/2004 |
| JP | 2006-147663 A | 6/2006 |
| JP | 2008-251966 A | 10/2008 |
| JP | 2009-26975 A | 2/2009 |
| WO | 2007/077666 A1 | 7/2007 |

OTHER PUBLICATIONS

Junichiro Nikaido et al., "A Highly Uniform and Reliable AlGaN/GaN HEMT"; www.gaasmantech.org/Digests2005/20005 papers 8.1.pdf., search made on Jun. 21, 2007.

Japanese Office Action dated Aug. 20, 2009, issued in corresponding Japanese Patent Application No. 2007-226594.

"German Office Action", mailed by German Patent Office and corresponding to German application No. 10 2008 032 897.9 on Apr. 9, 2010, with English translation, 15 pages.

* cited by examiner

NITRIDE SEMICONDUCTOR DEVICE, DOHERTY AMPLIFIER AND DRAIN VOLTAGE CONTROLLED AMPLIFIER

CROSS-REFERENCE TO RELATED APPLICATION

The present application is based on Japanese priority application No. 2007-226594 filed on Aug. 31, 2007, the entire contents of which are hereby incorporated by reference.

BACKGROUND

The present invention generally relates to compound semiconductor devices and more particularly to a high power compound semiconductor device that uses a nitride semiconductor of GaN or a nitride semiconductor containing GaN as the major component for the electron channel layer.

GaN has a large bandgap of 3.4 eV and is used conventionally for blue light-emitting diodes and laser diodes. On the other hand, in view of its large breakdown voltage and large saturation electron velocity, GaN is thought as a highly promising material for the semiconductor devices required to perform high voltage operation or high output operation. Thus, intensive investigations are being made for the FETs such as HEMT that uses GaN for the electron channel layer. Particularly, by using a high-voltage HEMT having an electron channel layer of GaN for the amplifier, it is expected that a high efficiency operation is attained.

Patent Reference 1
  Japanese Laid-Open Patent Application 2000-252458

Patent Reference 2
  Japanese Patent Application 2002-500626

Patent Reference 3
  Japanese Laid-Open Patent Application 2003-535481

Non-Patent Reference 1
  H. Kawai et al., Electronics Letters 19 Mar. 1998, Vol. 34, No. 6, pp. 592-593

Non-Patent Reference 2
  J. Nikaido, et al., A Highly Uniform and Reliable AlGaN/GaN HEMT, www.gaasmantech.org/Digests 2005/2005 papers 8.1 pdf (search made on Jun. 21, 2007)

SUMMARY

According to an aspect, there is provided a nitride semiconductor device, including: a substrate; a stacked semiconductor structure formed over said substrate and including a electron channel layer of an undoped nitride semiconductor and an electron supplying layer of an n-type nitride semiconductor formed epitaxially over said electron channel layer, said n-type nitride semiconductor having an electron affinity smaller than an electron affinity of said undoped nitride semiconductor and a two-dimensional electron gas being formed in said electron channel layer along an interface to said electron supply layer; a gate electrode formed over said stacked semiconductor structure in correspondence to a channel region; and source and drain electrodes formed over said stacked semiconductor structure in ohmic contact therewith respectively at a first side and a second side of said gate electrode, said stacked semiconductor structure including, between said substrate and said electron channel layer, an n-type conductive layer and a barrier layer containing Al formed consecutively and epitaxially.

BEST MODE FOR IMPLEMENTING THE INVENTION

With the amplifier for cell-phone base station designed for WiMAX (world interoperability for microwave access), there is a demand for unprecedented high efficiency. In order to achieve the desired high efficiency use of Doherty amplifier shown in FIG. 1 or drain voltage controlled amplifier shown in FIG. 2 is studied.

Figure 1:
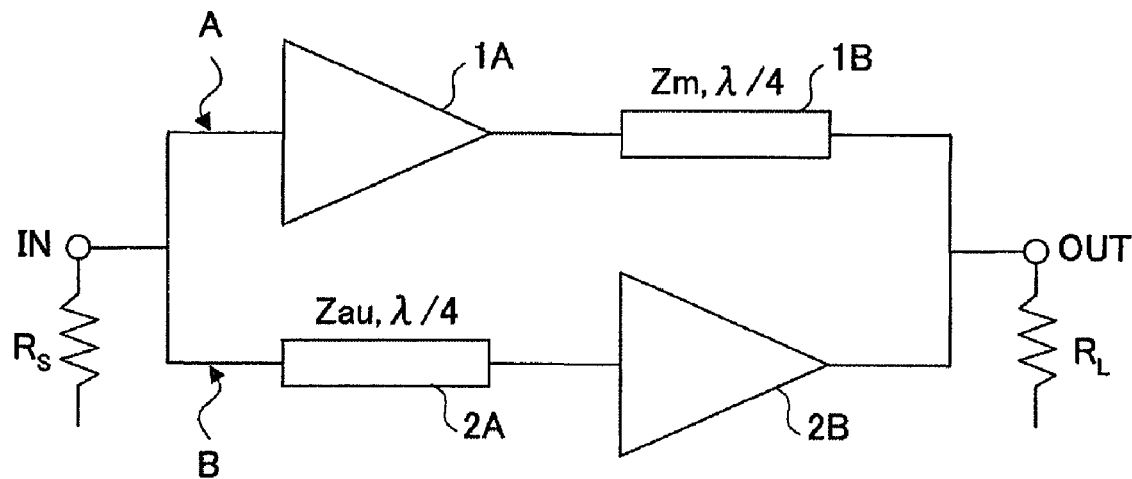
FIG. 1 is a circuit diagram showing the construction of a Doherty amplifier.
Figure 2:
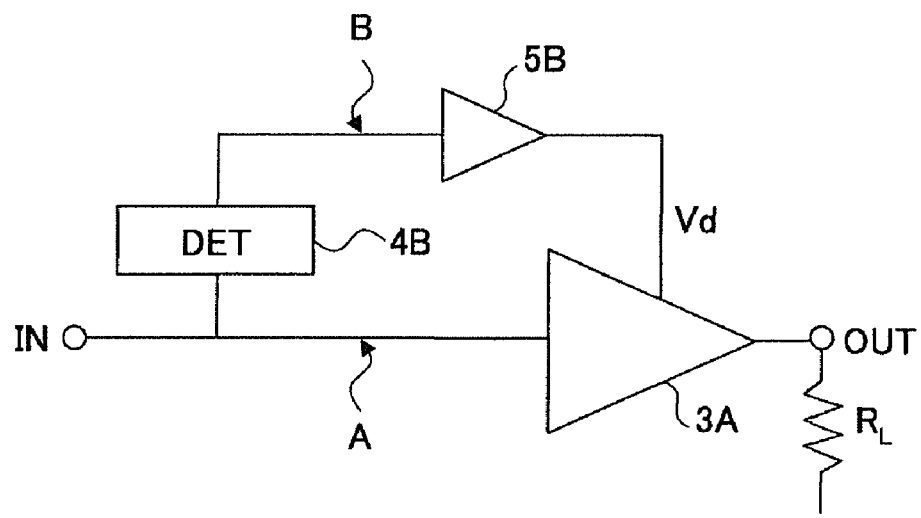
FIG. 2 is a circuit diagram showing the construction of a drain voltage controlled amplifier.

Referring to FIG. 1, a Doherty amplifier has a first signal path A including a carrier amplifier (referred to hereinafter as "main amplifier") 1A and a quarter wavelength line 2A, and a second signal path B including a quarter wavelength line 1B and a peak amplifier (referred to hereinafter as "auxiliary amplifier") 2B.

There, an incoming signal supplied to an input terminal IN having an input resistance Rs is divided into first and second signal paths A and B for amplification and are merged at an output terminal OUT to which a load impedance RL is connected. Thereby, the main amplifier 1A is biased for A class or AB class operation, while the auxiliary amplifier 2B is biased for C class operation, such that the idling current is reduced as compared with the case of the main amplifier 1A.

Figure 3:
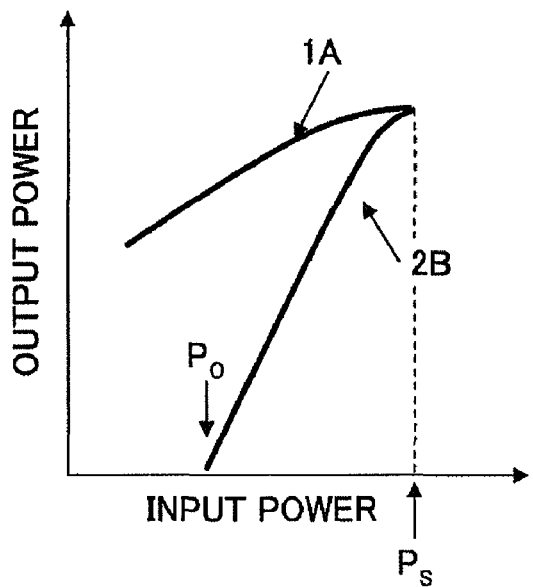
FIG. 3 is a diagram explaining the operation of the Doherty amplifier of FIG. 1.

As a result, as shown in FIG. 3, there is caused operation of the main amplifier 1A when the incoming signal has an ordinary power range, while when the power of the incoming signal has exceeded a predetermined power level $P_0$, there occurs the operation of the auxiliary amplifier 2B in addition to the main amplifier 1A, and it becomes possible to form the output signal with large output power. In FIG. 3, it should be noted that the horizontal axis represents the incoming power while the vertical axis represents the output power.

Figure 4:
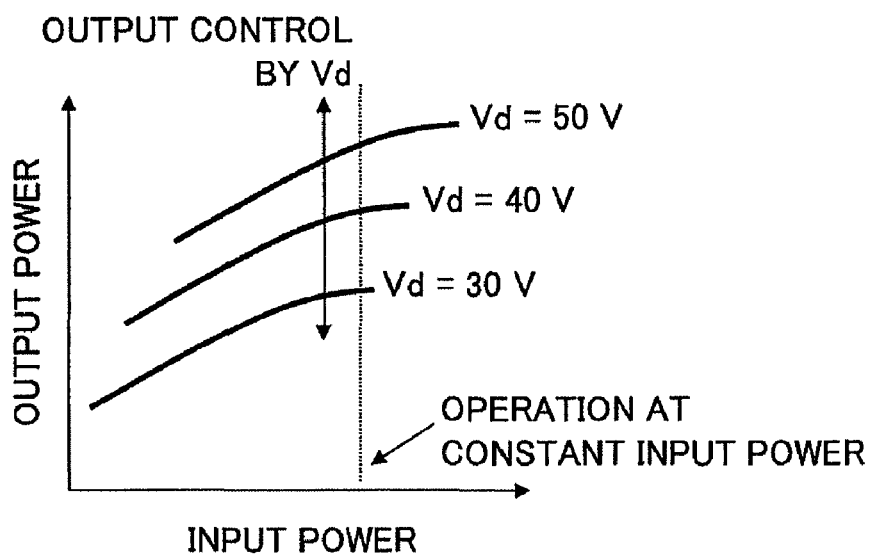
FIG. 4 is a diagram explaining the operation of the drain voltage controlled amplifier of FIG. 2.

With the drain voltage controlled amplifier, on the other hand, the incoming signal is supplied to a main amplifier 3A via a signal path A as shown in FIG. 2, while the incoming signal is also detected by a detector 4B in a signal path branched from the signal path A. Thereby, a control amplifier 5B provided to the signal path B controls a drain voltage Vd of the transistor constituting the main amplifier 3A based on a detection signal Vd indicative of the level of the incoming signal as shown in FIG. 4.

With the drain voltage controlled amplifier of FIG. 2, the main amplifier 3A is maintained in the saturation state and the output power thereof is controlled by the control amplifier 5B that controls the drain voltage Vd thereof in response to the input power. Thus, it is possible to maintain high operational efficiency with the drain voltage controller amplifier of FIG. 2.

Figure 5:
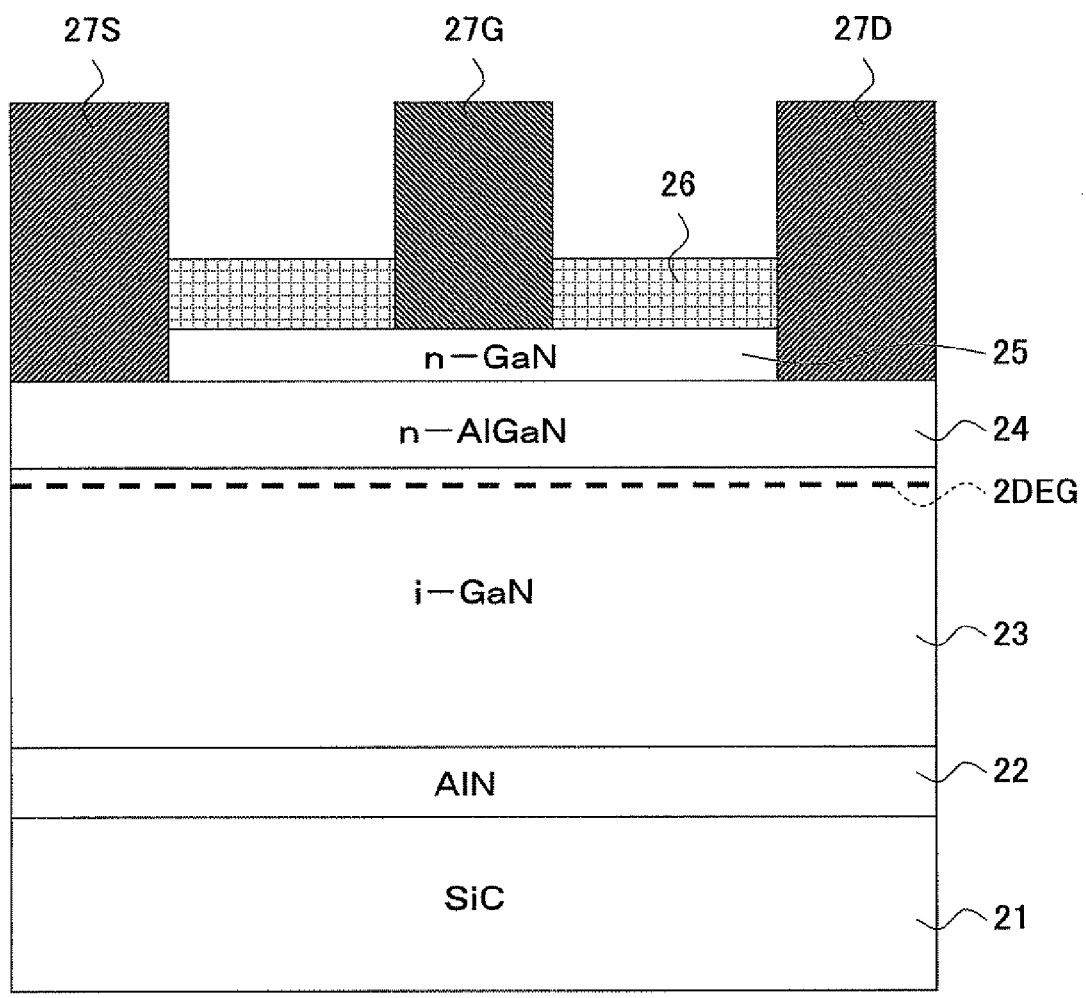
FIG. 5 is a diagram showing the construction of a GaN-HEMT according to a related art of the present invention.
Figure 6:
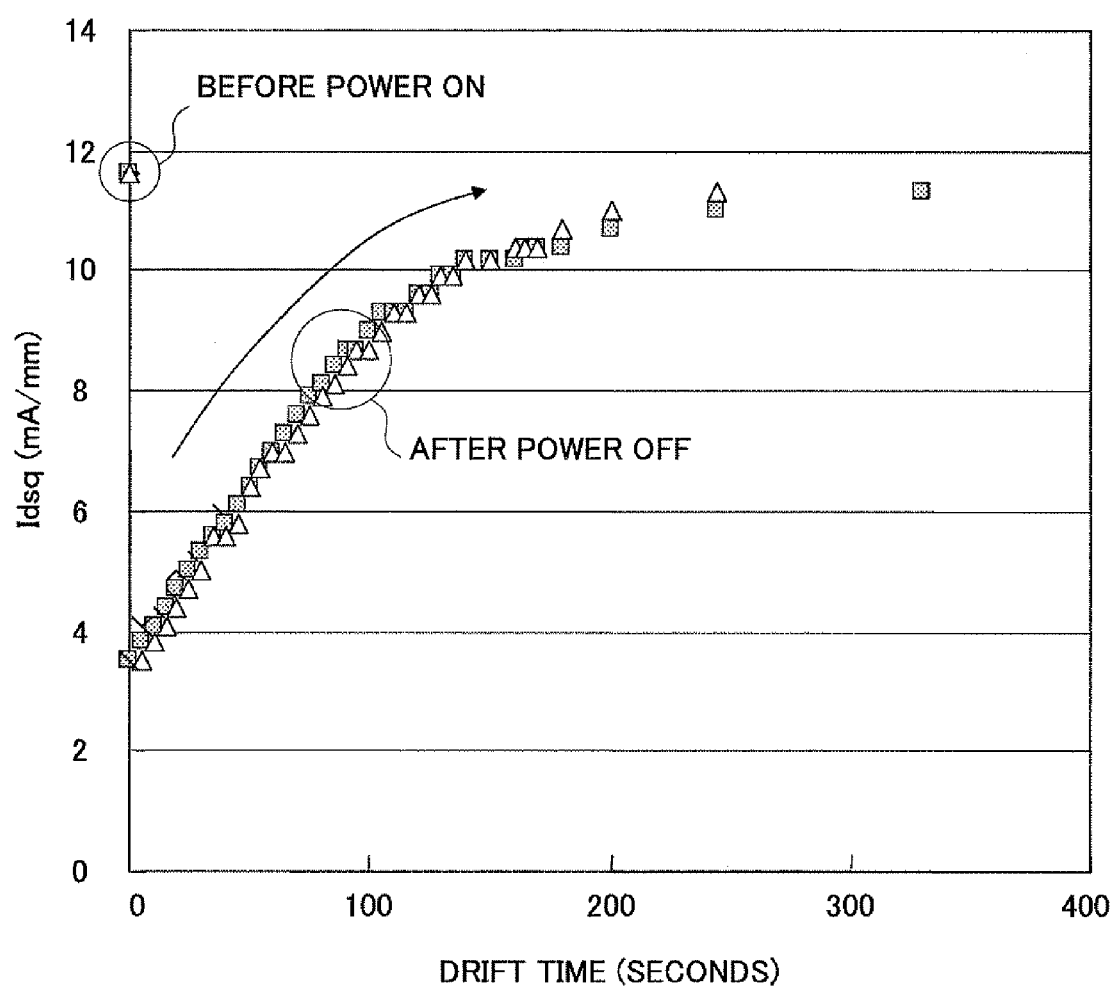
FIG. 6 is a diagram explaining the problem of the GaN-HEMT of FIG. 5.

Meanwhile, the inventor has encountered a problem, in the case a GaN-HEMT 20 having a electron channel layer of GaN as shown in the construction of FIG. 5 is used for the main amplifier 1A and the auxiliary amplifier 2B, that there occurs drifting of drain current as shown in FIG. 6. When such drifting occurs, there is caused a drop of operational efficiency of the amplifier, and it is no longer possible to obtain the desired high efficiency operation.

Referring to FIG. 5, the GaN-HEMT 20 is formed on an SiC substrate 21 and includes a buffer layer 22 of undoped AlN formed epitaxially on the SiC substrate 21, a electron channel layer 23 of undoped GaN formed epitaxially on the buffer layer 22, an electron supplying layer 24 of n-type AlGaN formed epitaxially on the electron channel layer 23, and a cap layer 25 of n-type GaN formed epitaxially on the electron supplying layer 24, wherein there is formed a gate electrode 27G on the cap layer 25 in correspondence to a predetermined channel region in Schottky contact therewith. Further, a source electrode 27S and a drain electrode 27D are formed on the electron supplying layer 24 at respective sides of the gate electrode 27G in ohmic contact therewith. Further, the exposed surface of the cap layer 25 is covered with an SiN passivation film 26.

FIG. 6 shows the change of the source-drain current Idsq for an idling state, in which the input power to the GaN-HEMT of FIG. 5 is turned off after increasing the input power to the auxiliary amplifier 2B from a threshold value $P_0$, which corresponds to the power immediately before power-ON of the auxiliary amplifier 2B, to the power level $p_s$, in which the auxiliary amplifier 2B performs the saturation operation. Reference should be made to FIG. 3. Further, it should be noted that the source-drain current Idsq represents the drain current obtained by power measurement in a static state (quiescent state).

Referring to FIG. 6, it can be seen that the idling current of the Ga-HEMT of about 12 mA/mm for the state immediately before power ON of the auxiliary amplifier 2B, is reduced to about 4 mmA/mm after power OFF. Further, it can be seen that the idling current increases gradually thereafter, while it takes a drift time of more than 300 seconds for recovering the original value for the idling current.

Figure 7:
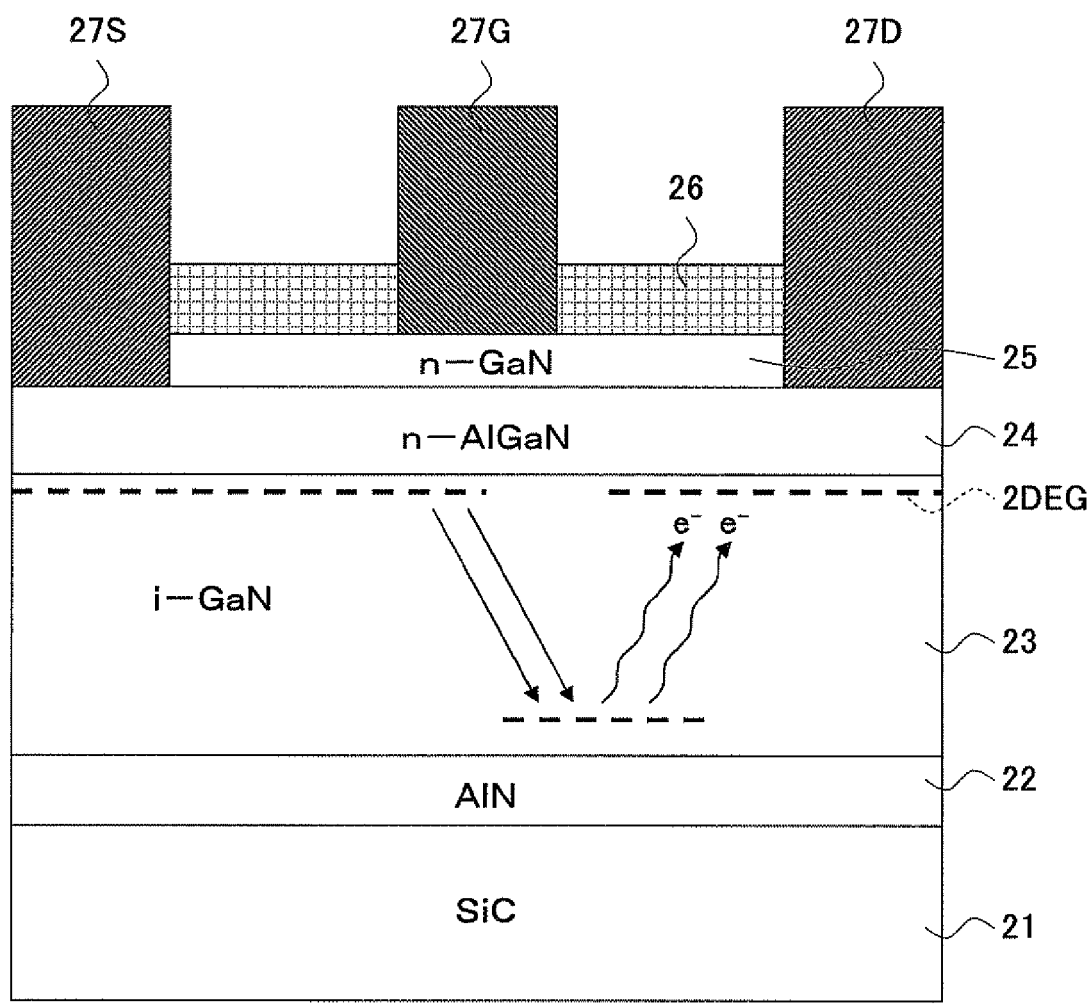
FIG. 7 is another diagram explaining the problem of the GaN-HEMT of FIG. 5.

This suggests the situation that, as shown in FIG. 7, the electrons in the two-dimensional electron gas have escaped from the electron channel layer 23 in the direction toward the SiC substrate 21 by the acceleration caused at the time of the high output power operation of the GaN-HEMT and trapped by the defects or the like, existing in the vicinity of the interface between the GaN electron channel layer 23 and the AlN under layer 22, and that the electrons thus trapped are released gradually after the power is turned OFF.

The problem of the drift time of FIGS. 6 and 7 indicates that the output current, and hence output power, of the auxiliary amplifier 2B is decreasing during the interval in which the auxiliary amplifier 2B is turned ON and that the GaN-HEMT used for the auxiliary amplifier 2B is not operating at the desired high efficiency. As a consequence, the auxiliary amplifier 2B is not providing the desired output.

The problem of FIG. 6 that the drift time increases with input power and hence with output power becomes a serious problem not only in the case the GaN-HEMT of FIG. 5 is used for the auxiliary amplifier 2B of the Doherty amplifier of FIG. 1 but also in the case the GaN-HEMT of FIG. 5 is used for the main amplifier 3A of the drain voltage controlled amplifier of FIG. 2. Reference should be made to the schematic diagram of FIG. 8.

Figure 8:
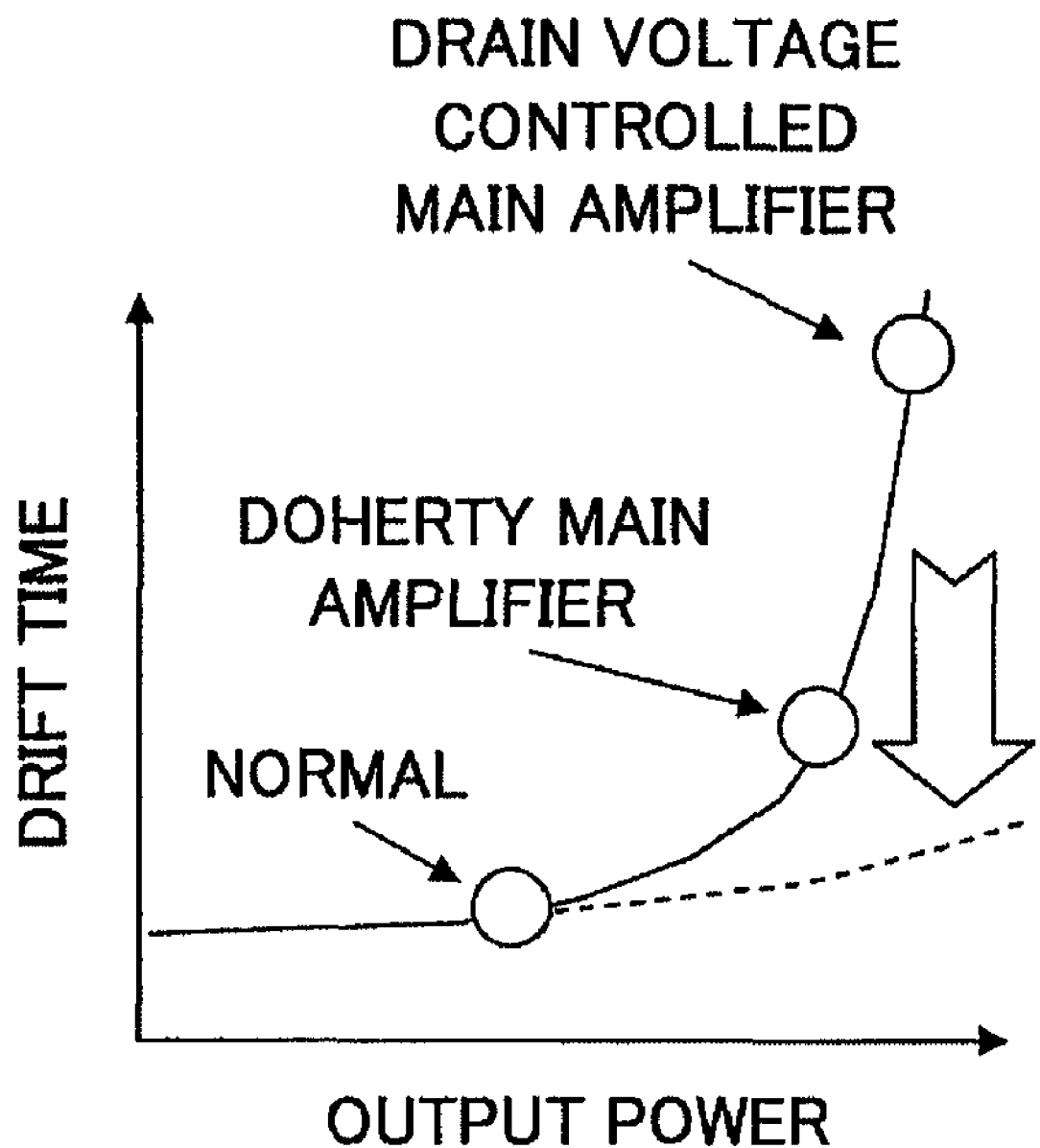
FIG. 8 is another diagram explaining the problem of the GaN-HEMT of FIG. 5.

Thus, as shown in FIG. 8 by an arrow, there is a desire to reduce the drift time in the GaN-HEMT of the construction of FIG. 5.

First Embodiment

Figure 9:
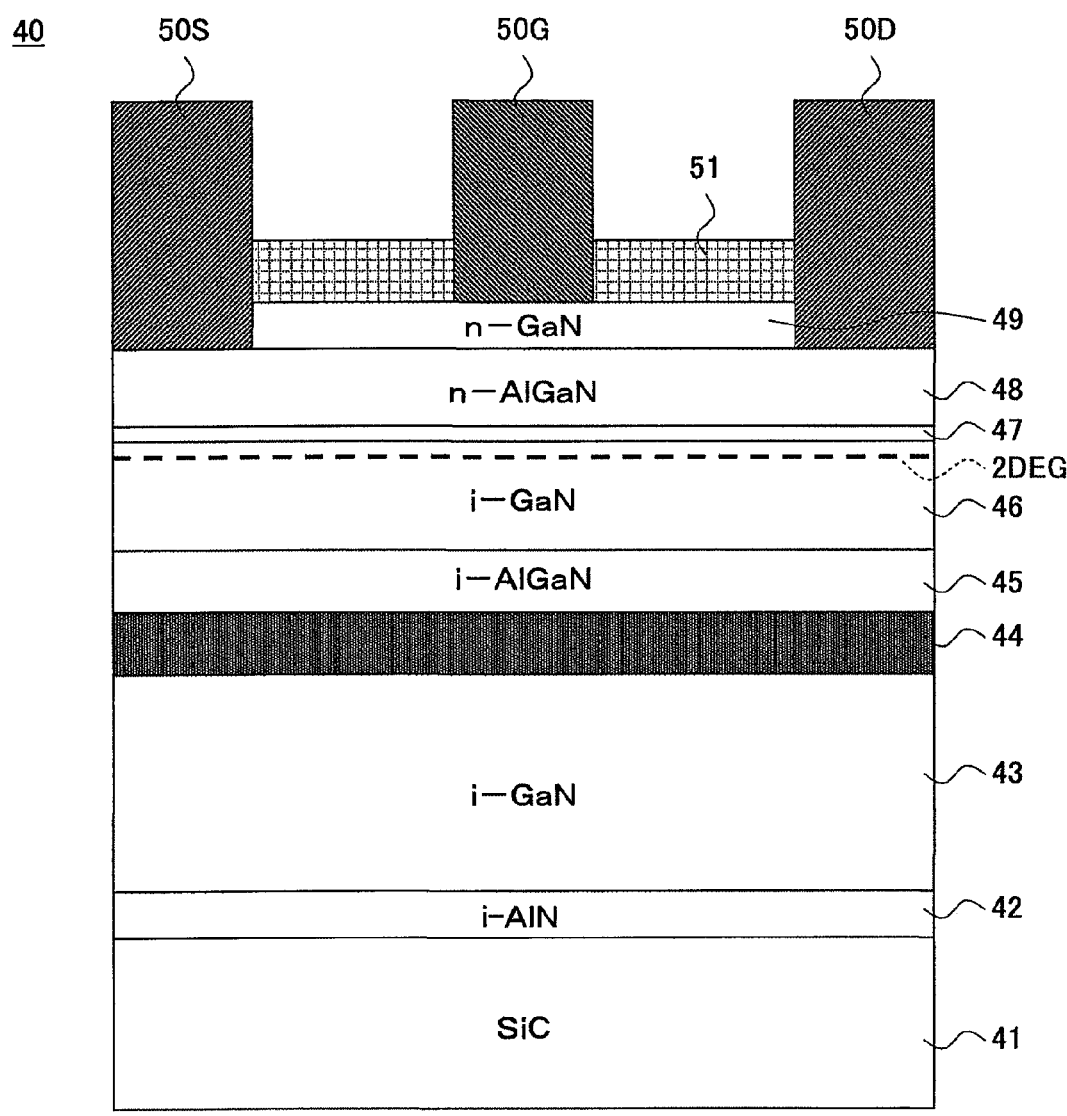
FIG. 9 is a diagram showing the construction of a GaN-HEMT according to a first embodiment of the present invention.

FIG. 9 shows the construction of a GaN-HEMT 40 according to a first embodiment.

Referring to FIG. 9, the GaN-HEMT 40 is formed on a (0001) surface of a SiC monocrystal substrate 41 and includes an undoped AlN under layer 42 formed epitaxially on the SiC substrate 41 with a thickness of 0.3 µm, an undoped GaAs buffer layer 43 formed epitaxially on the under layer 42 with a thickness of 3 µm, for example, an n-type GaN band control layer 44 formed epitaxially on the buffer layer 43 with a thickness of 5-50 nm, such as 20 nm, and doped with Si with a concentration of $1 \times 10^{17}$-$5 \times 10^{18}$ cm$^{-3}$, such as $2 \times 10^{18}$ cm$^{-3}$, an undoped AlGaN barrier layer 45 formed epitaxially on the band controller layer 44 with a thickness of 5-50 nm, preferably with the thickness of 20 nm, an undoped GaN electron channel layer 46 formed epitaxially on the barrier layer 45 with a thickness of 50 nm, for example, an n-type AlGaN electron supplying layer 48 formed epitaxially over the electron channel layer 46 with a thickness of 20 nm, for example, via an undoped AlGaN spacer layer 47 formed epitaxially with a thickness of 5 nm, for example, the electron supplying layer 48 being doped with Si with a concentration of $4 \times 10^{18}$ cm$^{-3}$, and a cap layer 49 of n-type GaN formed epitaxially on the electron supplying layer 48 with a thickness of 7 nm, for example, wherein the cap layer 49 is doped with Si with a concentration of $5 \times 10^{18}$ cm$^{-3}$.

In the electron supplying layer 46, there is formed a two-dimensional electron gas (2DEG) along an interface to the spacer layer 47 above. By providing the spacer layer 47, it is possible, as is well known in the art, to suppress scattering of the electrons in the two-dimensional electron gas by the dopant electrons in the electron supplying layer 48.

Further, on the cap layer 49, there is formed a gate electrode 50G in Schottky contact therewith in the form of stacking of a Ni layer and an Au layer with a gate length of 0.5 µm and a unit gate width of 300 µm. Here, "unit gate width" means the width of the region where control is made by the gate electrode for the concentration of the two-dimensional electron gas.

Further, at both lateral sides of the gate electrode 50G, there are formed a source electrode 50S and a drain electrode 50D in the form of stack of a Ta film (not shown) and an Al film (not shown) respectively in ohmic contact with the electron supplying layer 48. Thereby, it should be noted that there is formed a layer of $TaAl_3$ in the source electrode 50S or drain electrode 50D at the interface between the Ta film and the Al film as a result of mutual diffusion of Ta and Al. Further, a surface part of the cap layer 49 located between the gate electrode 50G and the source electrode 50S and further a surface part located between the gate electrode 50G and the drain electrode 50D are covered by an SiN protective film 51.

In the GaN-HEMT 40 of FIG. 9, it should be noted that the barrier layer 45 changes the composition thereof, represented as $Al_xGa_{1-x}N$, such that the compositional parameter x changes continuously from 0.02 at the interface to the electron channel layer 46 to 0.05 at the interface to the band control layer 44, and as a result, there occurs continuous increase of the bandgap from the interface to the electron channel layer 46 to the interface to the band control layer 44. Thus, with the 25 GaN-HEMT 40 of FIG. 9, the barrier layer 45 has a composition of $Al_{0.05}Ga_{0.95}N$ at the interface to the band control layer 44 and the composition of $Al_{0.02}Ga_{0.98}N$ at the interface to the electron channel layer 46.

Particularly, with the HEMT for use in high-efficiency amplifiers, it is preferable that the gate length falls in the range of 0.3-0.7 μm, more preferably to the range of 0.5-0.6 μm. When the gate length is increased beyond the foregoing range, there is caused decrease of gain for the Doherty amplifier. Further, there is caused deterioration of distortion characteristics. When the gate length becomes shorter than 0.5 μm, on the other hand, there is caused a drop of breakdown voltage to 200V or less. Further, there is caused decrease of efficiency because of deteriorated pinch-off characteristics. Thereby, reliability of the device is deteriorated.

Further, it is preferable to set the unit gate width to the range of 200-400 μm, preferably to the range of 250-300 μm. When the unit gate width is increased, there is caused decrease of gain for the Doherty amplifier, while when the unit gate width is narrowed, there is caused decrease of maximum output power that can be attained.

Next, the fabrication process of the GaN-HEMT 40 of FIG. 9 will be explained briefly.

First, the undoped AlN under layer 42 and the undoped GaN buffer layer 43 are grown epitaxially and consecutively on the substrate 41 of monocrystalline SiC substrate by an MOVPE process that uses trimethyl gallium (TMG) for the source of Ga, trimethyl aluminum (TMA) for the source of Al, and ammonia for the nitrogen source, and the n-type GaN band control layer 44 is grown further on the buffer layer 43 epitaxially by an MOVPE process that uses TMG and ammonia for the sources and silane ($SiH_4$) for the Si dopant gas.

Further, the undoped AlGaN barrier layer 45 is formed epitaxially on the band control layer 44 by an MOVPE process that uses TMG, TMA and ammonia gas for the source, and the electron channel layer 46 of undoped GaN is formed further thereon by an MOVPE process that uses TMG and ammonia gas for the source.

Further, the spacer layer 47 is formed on the electron channel layer 46 by an MOVPE method that uses TMG, TMA and ammonia gas for the source, and the MOVPE process is continued further by adding a silane gas. With this, the electron supplying layer 48 of n-type AlGaN is formed on the spacer layer 47. Further, the cap layer 49 of n-type GaN is formed epitaxially on the electron supplying layer 48 by an MOVPE process that uses TMG and nitrogen gas as the source.

Further, a resist pattern is formed on the cap layer 49 thus formed so as to expose a device isolation region, and formation of device isolation region (not shown) is conducted by injecting nitrogen ions by an ion implantation process while using such a resist pattern as a mask.

Further, a resist pattern is formed on the semiconductor layered structure thus obtained so as to expose predetermined source and drain regions, and a Ta film and an Aluminum film are deposited by a vacuum evaporation deposition process while using such a resist pattern as a mask respectively with a thickness of 10 nm and a thickness of 280 nm. Further, excessive Al film and Ta film are removed together with the resist pattern by a lift-off process, and with this, source and drain electrodes 50S and 50D are formed respectively on the source and drain regions.

Further, the source electrode 50S and the drain electrode 50D thus formed are annealed by a rapid thermal annealing process. With this, the Ta film and the Al film are caused to react with each other to form a $TaAl_3$ layer.

Further, the SiN film 51 is deposited on the structure thus obtained by a plasma CVD process. The resist film 51 thus deposited is then patterned by a resist process, and with this, there is formed a resist pattern having an opening exposing a part of the GaN cap layer 49 corresponding to the channel region.

Further, a Ni film and an Au film are deposited on such a resist pattern respectively with film thicknesses of 10 nm and 200 nm, followed by a lift-off process for removing the resist film. With this, the gate electrode 50G is formed in Schottky contact with the GaN film 49.

Further, openings are formed in the SiN film 51 for exposing the source electrode 50S and the drain electrode 50D, and with this, formation of the GaN-HEMT of FIG. 9 is completed.

Figure 10:
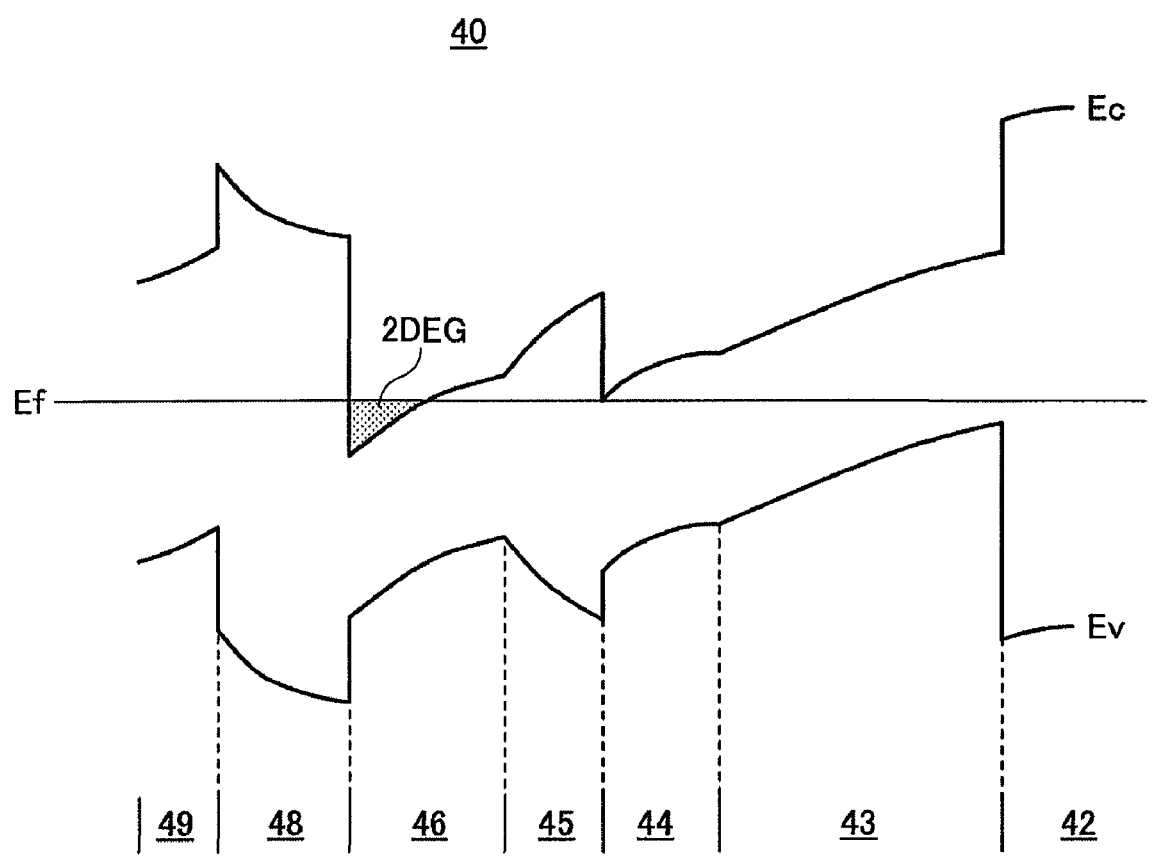
FIG. 10 is a diagram showing the band structure of the GaN-HEMT of FIG. 9.

FIG. 10 shows the band structure of the GaN-HEMT 40 of FIG. 9 taken along a cross-section perpendicular to the substrate 41. In the drawing, Ec represents the conduction band, Ev represents the valence band and Ef represents the Fermi level.

Referring to FIG. 10, there is formed a two-dimensional electron gas 2DEG at the interface between the electron channel layer 46 and the spacer layer 47 so as to fill the dip of the conduction band Ec, similarly to the case of ordinary HEMT. On the other hand, with the HEMT 40 of the present embodiment, the undoped-AlGaN barrier layer 45 underneath the electron channel layer 46 forms a potential barrier, and with this, escape of the electrons under acceleration in the two-dimensional electron gas toward the substrate 41 is blocked. Thereby, the band control layer 44 underneath the barrier layer 45 is formed of a highly doped n-type layer, and thus, the electric effect of the GaN buffer layer or the undoped AlN under layer underneath is screened.

Thus, even when high energy carriers have by some reason reached the GaN buffer layer 43 or the AlN under layer 42 underneath thereof, or to the interface to the SiC substrate 41 and captured therein, electric change is suppressed for the potential formed by the barrier layer 45, and the barrier layer 45 can form a stable potential barrier.

Figure 11:
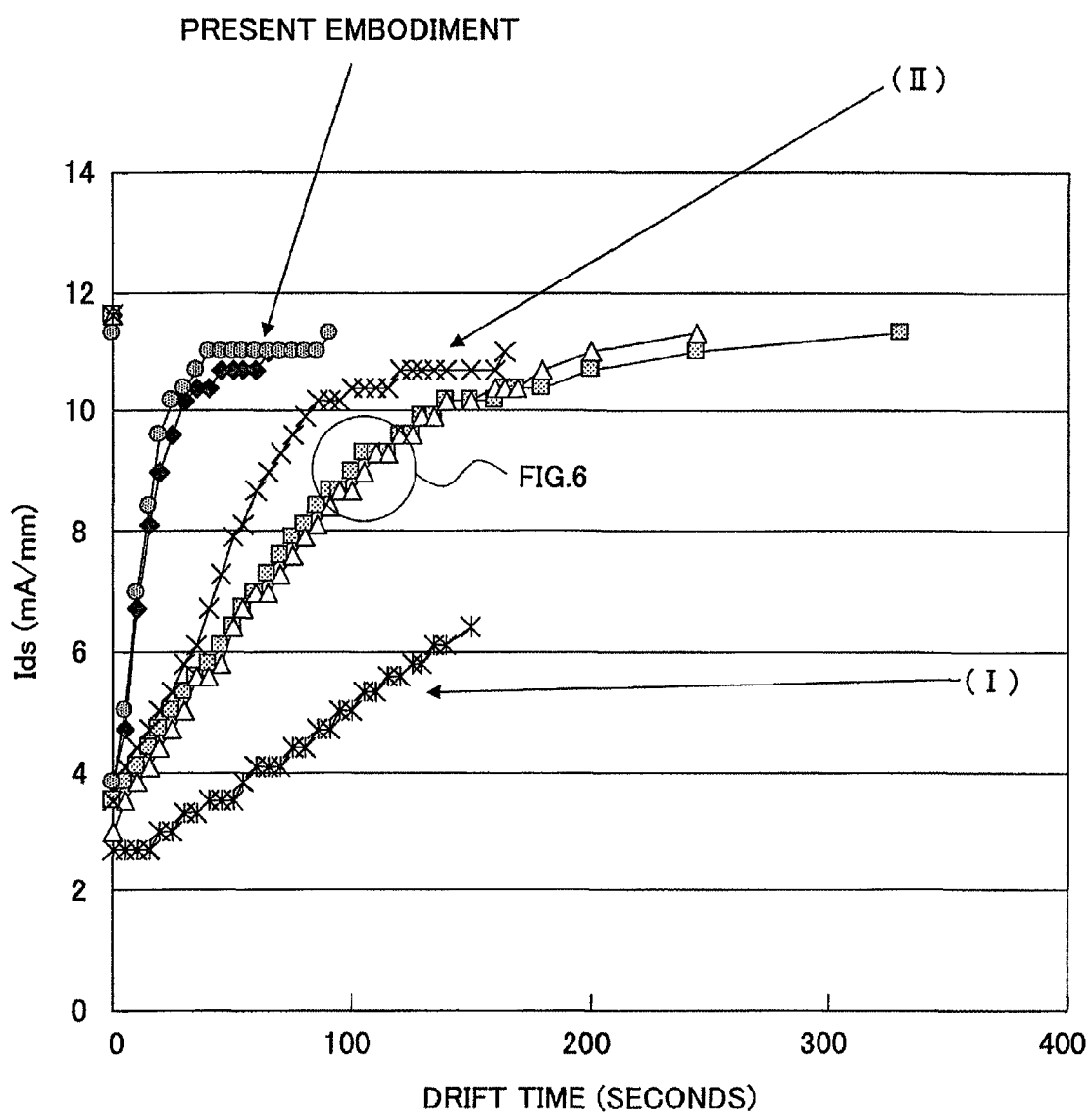
FIG. 11 is a diagram showing the time change of idling current in the GaN-HEMT of FIG. 9 in comparison with a comparative example.

FIG. 11 is a diagram showing the drift time of the GaN-HEMT 40 of FIG. 9 in comparison with the results of FIG. 6 explained previously and the results of the comparative examples of the present invention to be explained with reference to FIGS. 12 and 13. Similarly to FIG. 6, the horizontal axis represents the duration elapsed after power OFF, which is conducted subsequent to the saturation operation of the GaN-HEMT, while the vertical axis represents the drain current Idsq measured in the quiescent state.

Referring to FIG. 11, it can be seen that the drift time is reduced to 50 seconds or less with the GaN-HEMT 40 of FIG. 9, contrary to the case of FIG. 6 where the drift time is 300 seconds or more.

Figure 12:
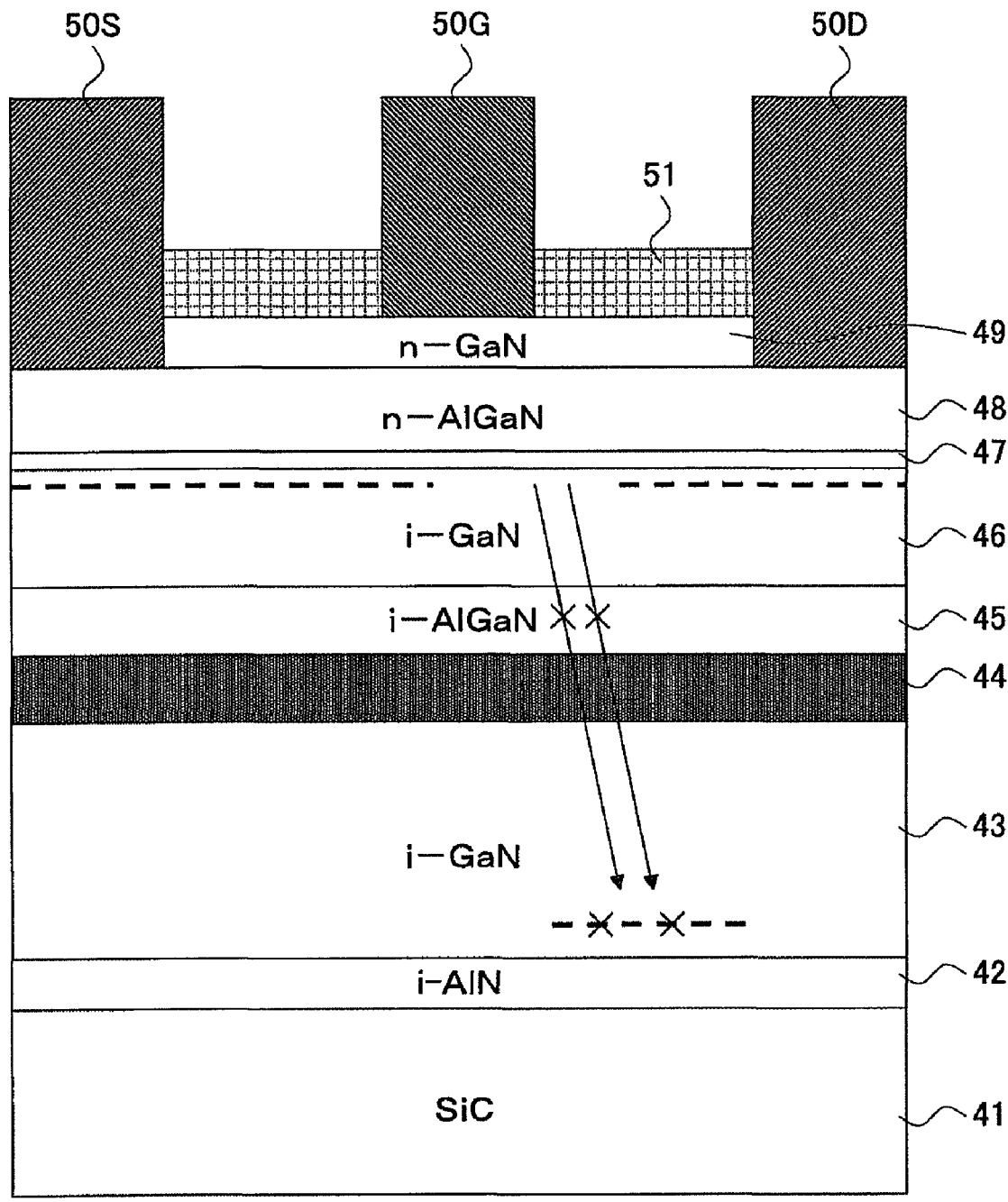
FIG. 12 is a diagram explaining the function of the present invention.
Figure 13:
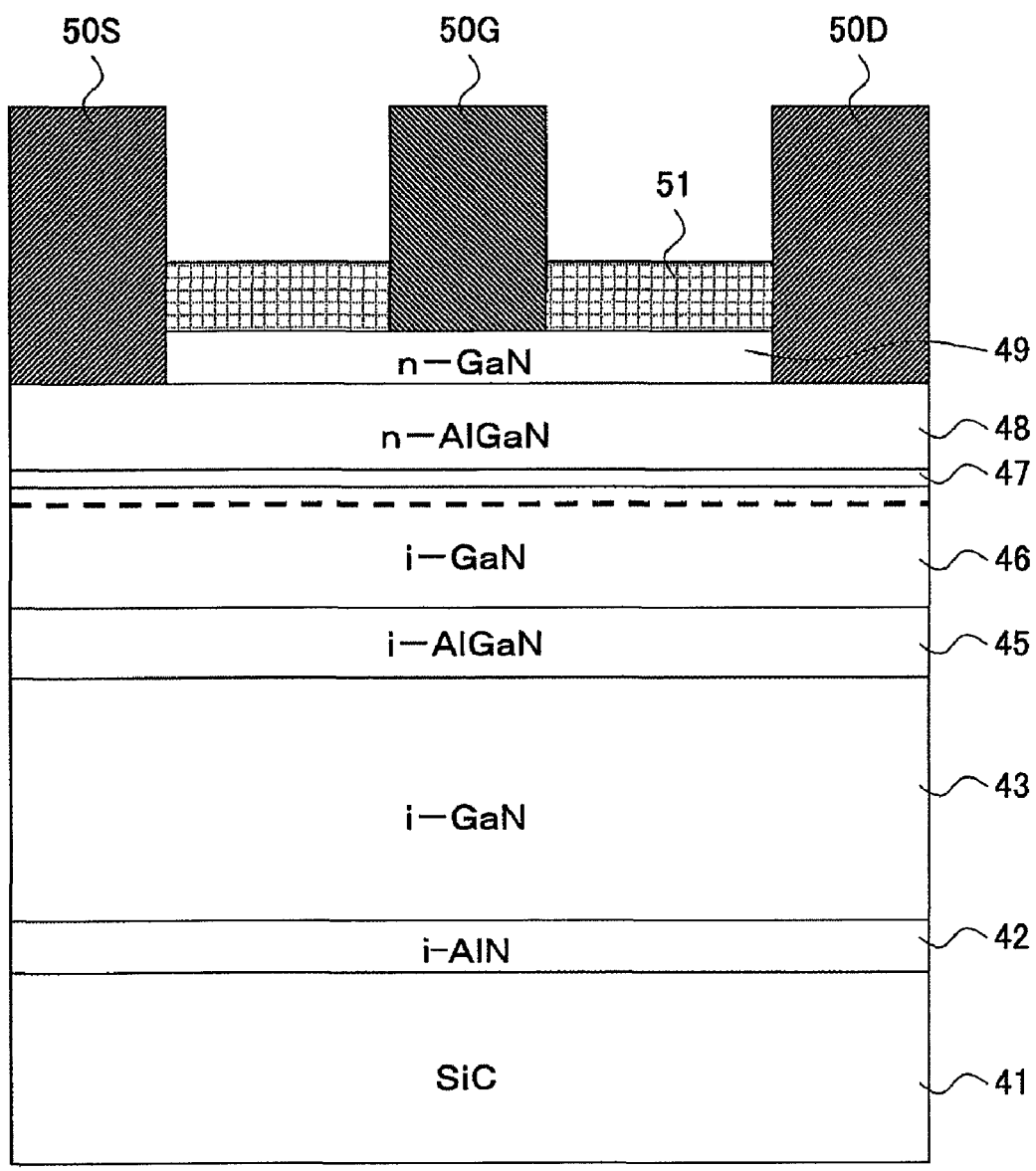
FIG. 13 is a diagram showing the construction of a GaN-HEMT according to a comparative example (I) of FIG. 11.

The results of FIG. 11 indicates that, as shown in FIG. 12, the barrier layer 45 functions effectively with the GaN-HEMT 40 of FIG. 9 and escape of the accelerated electrons from the two-dimensional electron gas in the direction toward the substrate as explained with reference to FIG. 7 is effectively suppressed.

It should be noted that the comparative example of FIG. 11 indicated by (I) corresponds to the case in which the band control layer 44 is omitted in the construction of FIG. 9. There, it can be seen that one-half of the initial drain current is still not recovered after the time of 200 seconds has elapsed from moment of power OFF. Thus, with the construction of FIG. 13, there is a possibility that the barrier layer 45 is not functioning effectively, or the barrier layer 45 has become a trap. In FIG. 13, those parts explained before are designated by the same reference numerals and the description thereof will be omitted.

Figure 14:
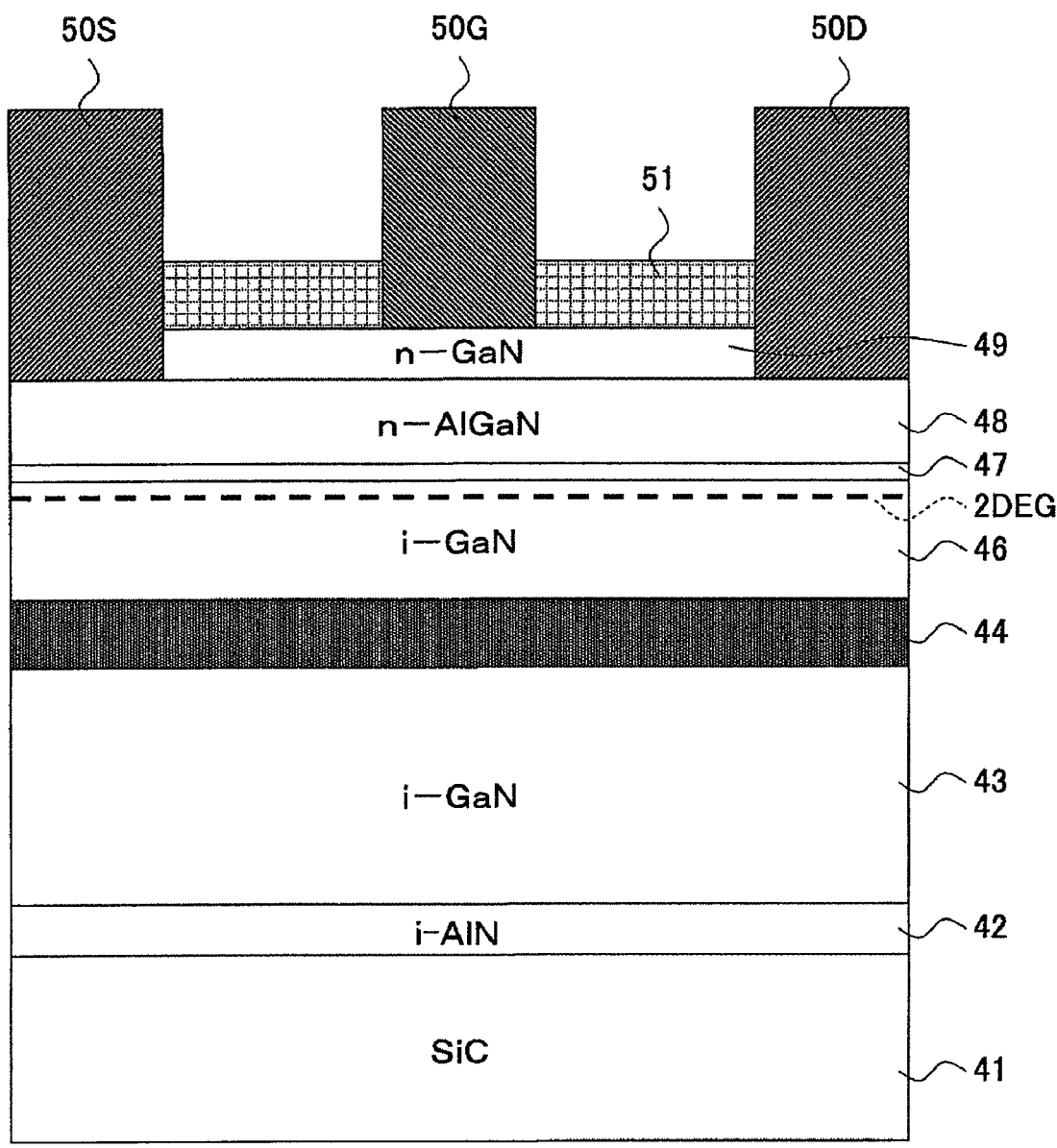
FIG. 14 is a diagram showing the construction of a GaN-HEMT according to a comparative example (II) of FIG. 11.

Further, the comparative example of FIG. 11 indicated by (II) corresponds to the case in which the barrier layer 45 is omitted in the construction of FIG. 9 as shown in FIG. 14. There, it can be seen that the drift time is improved somewhat over the case of FIG. 5, yet the drift time exceeds 100 seconds, and the performance is still inferior to the case of the present invention. In FIG. 14, those parts explained before are designated by the same reference numerals and the description thereof will be omitted.

Thus, with the present invention, it is important to use the band control layer 44 of n-type GaN in combination with the barrier layer 45 of undoped AlGaN. As noted already, it is believed that the band control layer 44, having electric conductivity, screens the electrical effects of the defects existing in the undoped GaN buffer layer 43 or the undoped AlN under layer 45, and thus suppresses the variation of the potential barrier formed by the conduction band of the barrier layer 45.

In order to attain such an effect, it is thought preferable to form the band control layer 44 under the barrier layer 45, and hence at the side closer to the substrate.

While the present embodiment changes the Al composition x of the composition graded barrier layer 45 from 0.02 to 0.05, the range of compositional change of the compositional graded barrier layer 45 is not limited to those explained previously. Thus, it is also possible to change the Al composition x from 0 to 0.07 from the interface to the band control layer 44 to the interface to the electron channel layer 46. Thereby, it is possible to set the composition x to the range of 0-0.03 at the interface to the band control layer 44 and to the range of 0.03-0.07 at the interface to the electron channel layer 46.

When the Al composition x of the composition graded barrier layer 45 exceeds the foregoing range, there occurs increase of defects in the layer 45 and the composition graded barrier layer 45 changed to be a trap. When the Al composition x is decreased below the foregoing range, on the other hand, the effect of barrier is not attained.

Further, in order to attain sufficient barrier effect and at the same time to suppress occurrence of dislocations caused by lattice misfit, it is preferable to form the composition graded barrier layer 45 to have a film thickness in the range of about 2-50 nm such that the critical thickness of dislocation formation is not exceeded.

In order that the band control layer 44 performs the desired function, it is not necessary that the entirety of the layer 44 is doped to n-type of high concentration. Thus, it is also possible to form the layer 44 such that only the part thereof contacting with the barrier layer 45 is doped to the n-type. The band control layer 44 may be formed to have a thickness of 5-100 nm. Further, the interface part of the barrier layer 45 that contacts with the band control layer 44 may be doped to n-type.

While the present embodiment has used an SiC substrate for the substrate, the present invention is not limited to the case of using a SiC substrate. Thus, it is also possible with the present invention to use a sapphire substrate, a GaN monocrystalline substrate, a heteroepitaxial substrate, in which a GaN layer is formed on a Si substrate via a buffer layer, an the like.

Further, it is possible to control a threshold value of the GaN-HEMT 40 by using AlGaInN in place of AlGaN for the electron supplying layer 48 and the spacer layer 47 and adjusting the bandgap of the electron supplying layer 48 and the spacer layer 47 by controlling the In content.

Further, it is also possible to form the electron channel layer 46, the spacer layer 47 and the electron supplying layer 48 by other semiconductor nitride.

Figure 15:
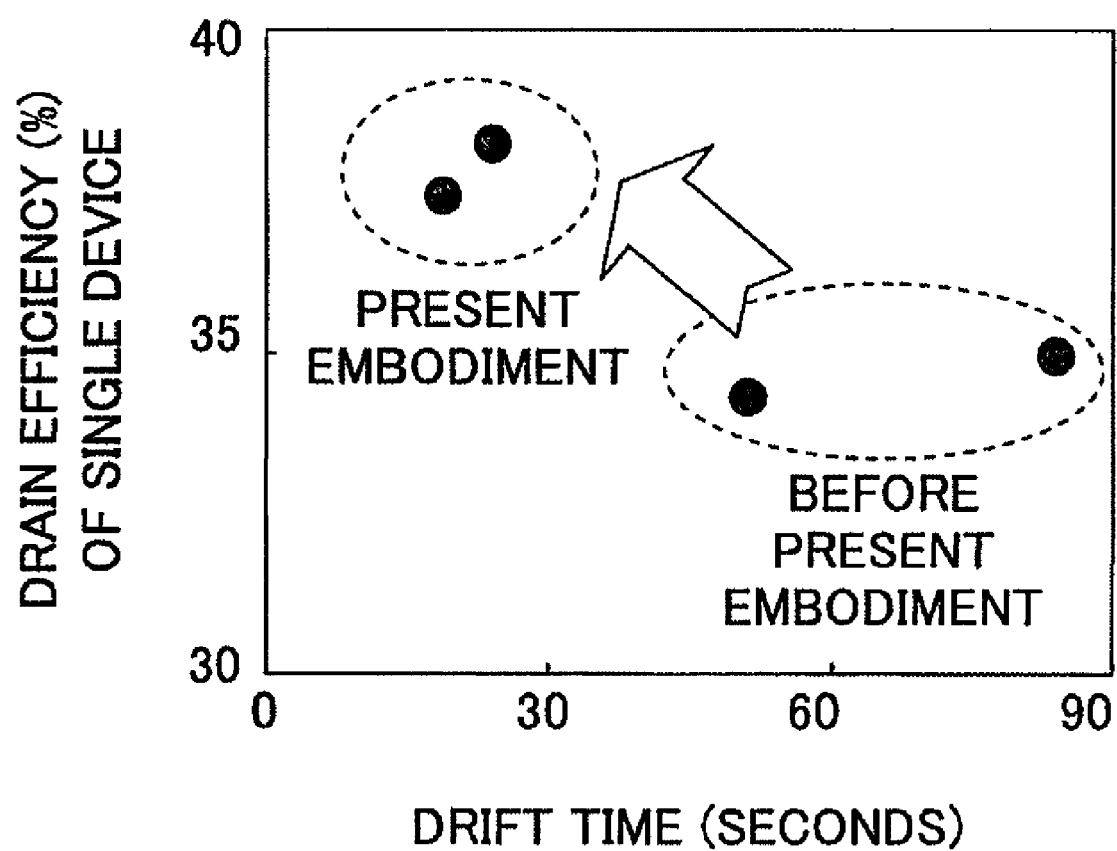
FIG. 15 is a diagram explaining the effect of the present invention.

FIG. 15 compares the drift time and the drain efficiency of a single GaN-HEMT for the case the GaN-HEMT 20 of FIG. 5 is used for the main amplifier 1A and the auxiliary amplifier 2B of the Doherty amplifier of FIG. 1 and the case in which the GaN-HEMT 20 of FIG. 5 is used for the main amplifier 3A of the drain voltage controlled amplifier of FIG. 2 ("BEFORE PRESENT EMBODIMENT"), and for the case the GaN-HEMT 40 of the present embodiment is used for the main amplifier 1A and the auxiliary amplifier 2B of the Doherty amplifier of FIG. 1 and the case in which the GaN-HEMT 40 of FIG. 9 is used for the main amplifier 3A of the drain voltage controlled amplifier of FIG. 2 ("PRESENT EMBODIMENT").

Referring to FIG. 15, it can be seen that the drift time is reduced to one-half or less by the use of the construction of the present embodiment. Further, because of efficient suppression of escape of electrons fro the two-dimensional electron gas 2DEG as explained with reference to FIG. 12, it can be seen that there is attained remarkable improvement of drain efficiency with the use of the construction of the present embodiment.

Second Embodiment

Figure 16:
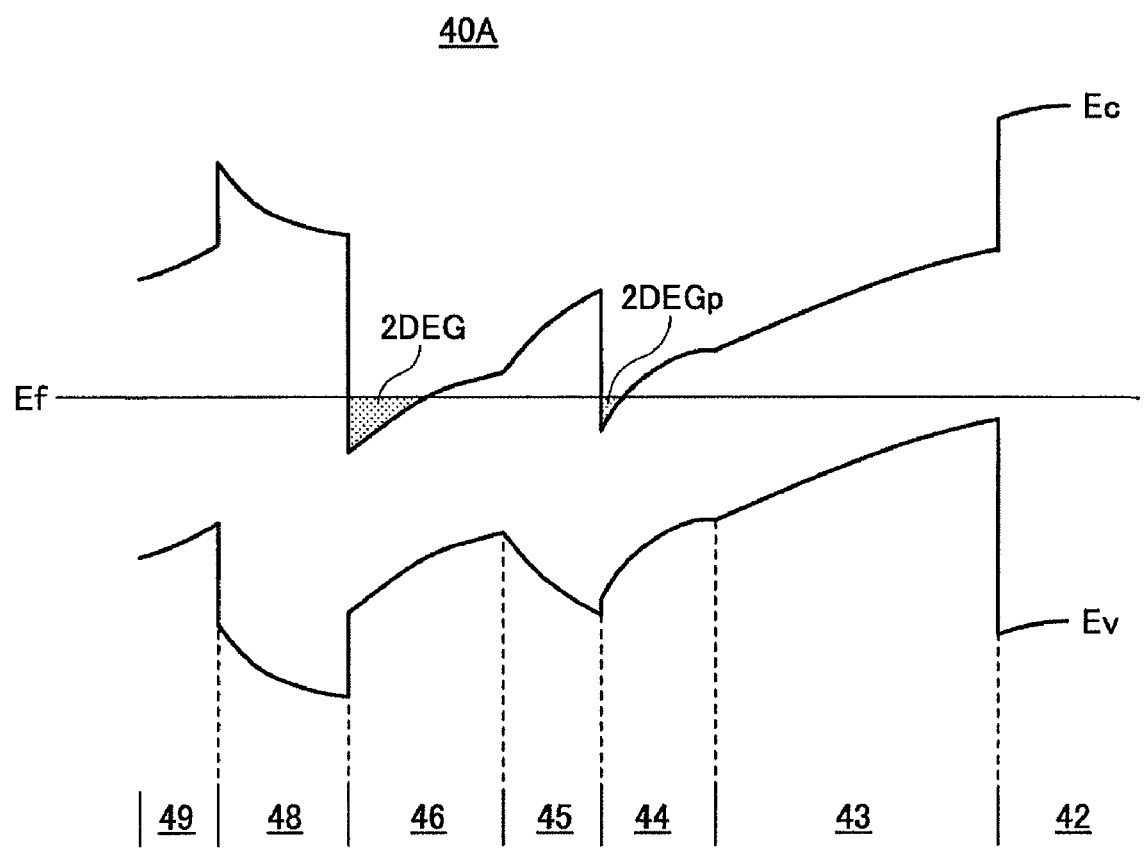
FIG. 16 is a diagram showing the band structure of a GaN-HEMT according to a second embodiment of the present invention.

FIG. 16 shows the band structure of a GaN-HEMT 40 according to a second embodiment. Because the GaN-HEMT 40A of the present embodiment has a construction similar to that of the GaN-HEMT 40 of FIG. 9 explained before, the description of the structure thereof will be omitted.

In the GaN-HEMT 40 of the previous embodiment, in which the band control layer 44 is doped to n-type, there has been caused pushing down of the conduction band Ec, but the conduction band never becomes lower than the Fermi level Ef as represented in FIG. 10. Thus, with the GaN-HEMT 40, there has never been the case in which there is formed another two-dimensional gas 2DEG different from the two-dimensional electron gas 2DEG in the electron channel layer 46.

On the other hand, with the present embodiment, the doping concentration of Si in the band control layer 44 is increased further, and as a result, the conduction band Ec of the band control layer 44 is pushed down below the Fermi level Ef. Thus, there is formed a two-dimensional electron gas 2DEG in such a part where the conduction band Ec is pushed down below the Fermi level Ef.

It should be noted that formation of such a two-dimensional electron gas 2DEG does not cause any substantial influence upon normal operation of the HEMT 40A in view of the fact that the two dimensional gas 2DEG formed in the electron channel layer 46 of undoped GaN has an electron mobility of 1500 cm$^2$/V·s while the two electron gas 2DEG formed in the highly doped GaN layer 44 has an electron mobility of at best about 100 cm$^2$/V·s.

Third Embodiment

Figure 17:
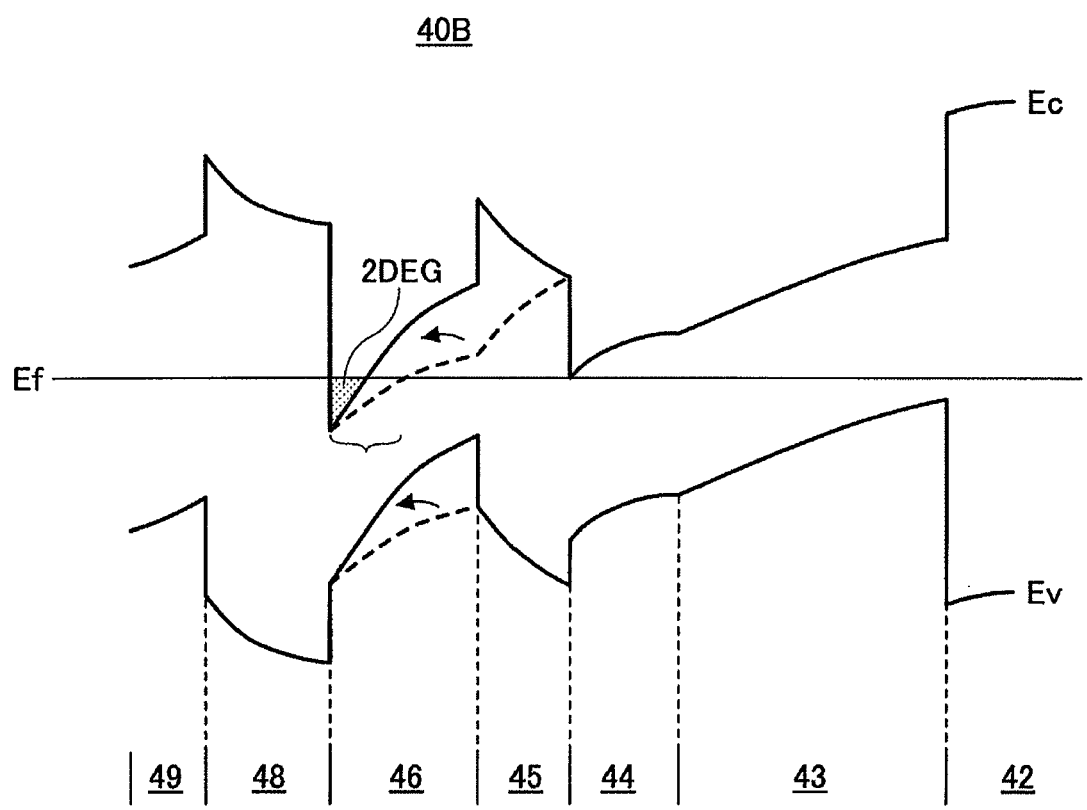
FIG. 17 is a diagram showing the band structure of a GaN-HEMT according to a third embodiment of the present invention.

FIG. 17 shows the band structure of a GaN-HEMT 40B according to a third embodiment. Because the GaN-HEMT 40B of the present embodiment has a construction similar to that of the GaN-HEMT 40 of FIG. 9 explained before, the description of the structure thereof will be omitted.

With the embodiments of FIGS. 9 and 10 and FIG. 16, the barrier layer 45 has been formed in the form of a compositional graded layer having a small bandgap at the side contacting to the electron channel layer 46 and a large bandgap at the side contacting with the band control layer 44.

However, it is not necessary with the present invention that the barrier layer 45 is formed of such a compositional graded layer, and it is also possible to form the barrier layer 45 by an AlGaN layer of uniform Al composition as shown in FIG. 17. Here, it should be noted that FIG. 17 shows the band structure of the GaN-HEMT 40B according to the third embodiment of the present invention.

Because the GaN-HEMT 40B has a construction similar to that of the GaN-HEMT 40 of FIG. 9 explained before with regard to other aspects, the description of the structure thereof will be omitted.

Because the barrier layer 45 has a uniform composition of $Al_{0.05}Ga_{0.95}N$ with the present embodiment, it should be noted that the location of the conduction band Ec and the valence band Ev in the electron channel layer 46 is changed from the state of FIG. 10 shown in the drawing by a broken line, and with this, the thickness, and hence the electron density of the two-dimensional electron gas formed in the electron channel layer 46 is reduced slightly.

As long as such decrease of the two-dimensional electron gas is tolerated, it is possible to use an AlGaN layer of uniform Al composition for the barrier layer as in the case of the present embodiment.

Fourth Embodiment

Figure 18:
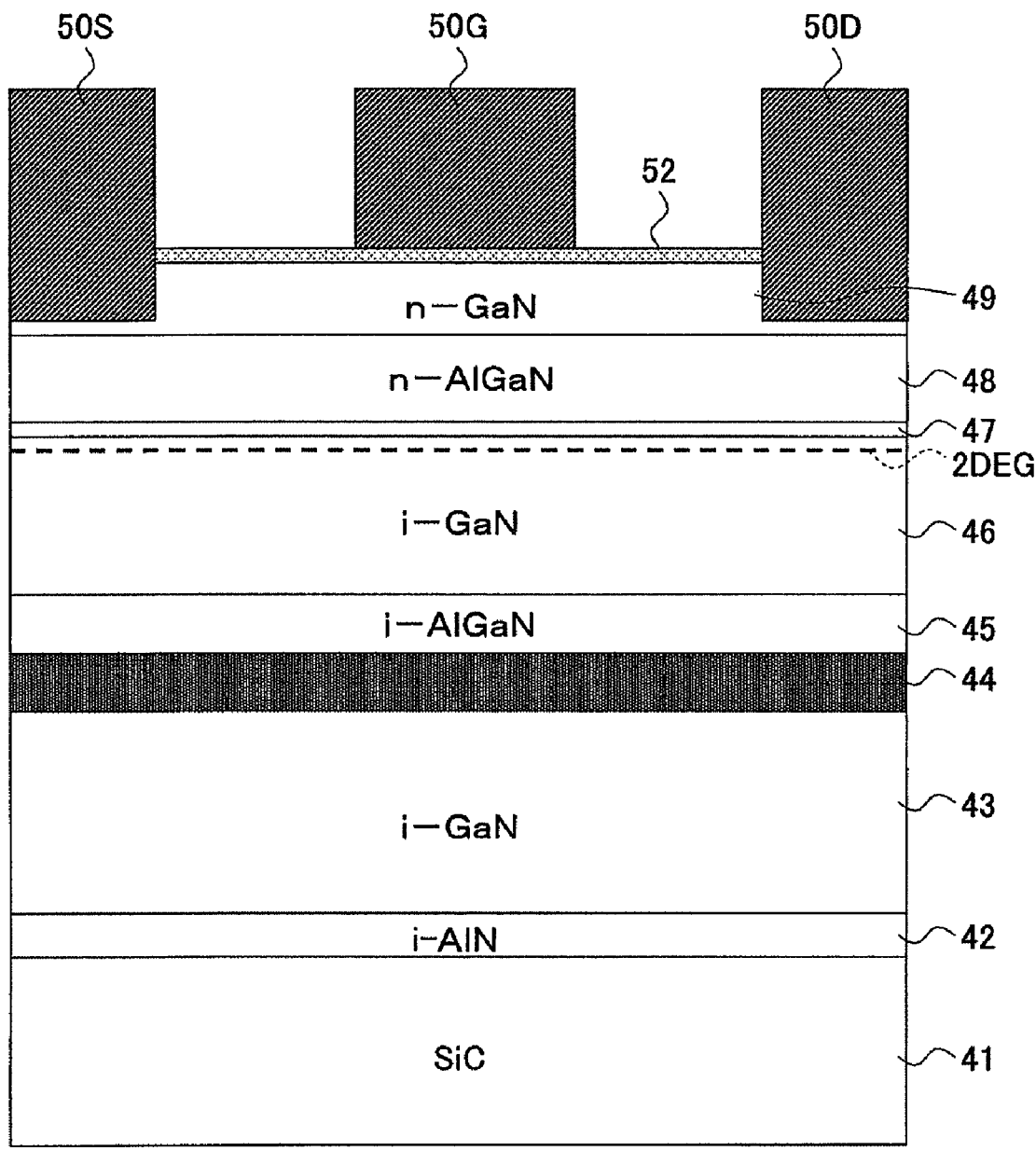
FIG. 18 is a diagram showing the construction of a GaN-HEMT according to a fourth embodiment of the present invention.

Further, it should be noted that the present invention is applicable, not only to the GaN-HEMT where the gate electrode 50G forms Schottky contact, but also in the GaN-HEMT having an insulated gate structure in which the gate electrode 50G makes a contact with a gate insulation film 52 as showing in FIG. 18, for example. In FIG. 18, those parts explained before are designated by the corresponding reference numerals and the description thereof will be omitted.

In the example of FIG. 18, the gate insulation film 52 is formed on the cap layer 49 of n-type GaN, while it is also possible to omit the cap layer and form the gate insulation film directly on the electron supplying layer 48.

For the gate insulation film 52, a widegap material such as SiN can be used. On the other hand, it is also possible to form the gate insulation film 52 by a so-called high-K material such as $Al_2O_3$, $Ta_2O_5$, $HfO_2$, $ZrO_2$, and the like.

While the present invention has been explained for preferred embodiments, the present invention is not limited to such specific embodiments and various variations and modifications may be made within the scope of the invention described in patent claims.

What is claimed is:

1. A nitride semiconductor device, comprising:
   a substrate;
   a stacked semiconductor structure formed over said substrate and including a electron channel layer of an undoped nitride semiconductor and an electron supplying layer of an n-type nitride semiconductor formed epitaxially over said electron channel layer, said n-type nitride semiconductor having an electron affinity smaller than an electron affinity of said undoped nitride semiconductor and a two-dimensional electron gas being formed in said electron channel layer along an interface to said electron supplying layer;
   a gate electrode formed over said stacked semiconductor structure in correspondence to a channel region; and
   source and drain electrodes formed over said stacked semiconductor structure in ohmic contact therewith respectively at a first side and a second side of said gate electrode,
   said stacked semiconductor structure including, between said substrate and said electron channel layer, an n-type conductive layer and a barrier layer containing Al formed consecutively and epitaxially, and an n-type band control layer between said n-type conductive layer and said barrier layer.

2. The nitride semiconductor device as claimed in claim 1, wherein said n-type conductive layer and said electron channel layer contain Ga and N as constituent elements thereof, while said barrier layer contains Ga, N and Al as constituent elements thereof.

3. The nitride semiconductor device as claimed in claim 1, wherein said barrier layer increases an Al composition thereof continuously from a side thereof contacting to said electron supplying layer to a side thereof contacting said n-type conductive layer.

4. The nitride semiconductor device as claimed in claim 3, wherein said Al composition, represented in terms of an Al compositional parameter x representing a composition of said barrier layer as $Al_xGa_{1-x}N$, falls in a range of 0.03-0.07 at an interface to said conductive layer and falls in a range of 0.0-0.3 at an interface to said electron channel layer.

5. The nitride semiconductor device as claimed in claim 4, wherein said barrier layer has a film thickness in the range of 2-50 nm.

6. The nitride semiconductor device as claimed in claim 1, wherein said barrier layer is doped to n-type at a part thereof adjacent to an interface to said n-type conductive layer.

7. The nitride semiconductor device as claimed in claim 1, wherein said n-type conductive layer is doped with an n-type dopant with a concentration level in the range of $1 \times 10^{17}$-$5 \times 10^{18}$ cm$^{-3}$.

8. The nitride semiconductor device as claimed in claim 1, wherein said n-type conductive layer is doped to n-type at a part thereof adjacent to an interface to said barrier layer.

9. The nitride semiconductor device as claimed in claim 1, wherein said n-type conductive layer has a film thickness of 5-100 nm.

10. A Doherty amplifier comprising a carrier amplifier and a peak amplifier, each of said carrier amplifier and peak amplifier comprising a nitride semiconductor device, said nitride semiconductor device comprising:
    a substrate;
    a stacked semiconductor structure formed over said substrate and including a electron channel layer of an undoped nitride semiconductor and an electron supplying layer of an n-type nitride semiconductor formed epitaxially over said electron channel layer, said n-type nitride semiconductor having an electron affinity smaller than an electron affinity of said undoped nitride semiconductor and a two-dimensional electron gas being formed in said electron channel layer along an interface to said electron supplying layer;

a gate electrode formed over said stacked semiconductor structure in correspondence to a channel region; and source and drain electrodes formed over said stacked semiconductor structure in ohmic contact therewith respectively at a first side and a second side of said gate electrode, said stacked semiconductor structure including, between said substrate and said electron channel layer, an n-type conductive layer and a barrier layer containing Al formed consecutively and epitaxially, and an n-type band control layer between said n-type conductive layer and said barrier layer.

11. A drain voltage controlled amplifier comprising a main amplifier amplifying an incoming signal and a control amplifier controlling a drain voltage in response to a level of said incoming signal, said main amplifier comprising a nitride semiconductor device, said nitride semiconductor device comprising:

a substrate;

a stacked semiconductor structure formed over said substrate and including a electron channel layer of an undoped nitride semiconductor and an electron supplying layer of an n-type nitride semiconductor formed epitaxially over said electron channel layer, said n-type nitride semiconductor having an electron affinity smaller than an electron affinity of said undoped nitride semiconductor and a two-dimensional electron gas being formed in said electron channel layer along an interface to said electron supplying layer;

a gate electrode formed over said stacked semiconductor structure in correspondence to a channel region; and source and drain electrodes formed over said stacked semiconductor structure in ohmic contact therewith respectively at a first side and a second side of said gate electrode, said stacked semiconductor structure including, between said substrate and said electron channel layer, an n-type conductive layer and a barrier layer containing Al formed consecutively and epitaxially, and an n-type band control layer between said n-type conductive layer and said barrier layer.

* * * * *